(12) United States Patent
Ku et al.

(10) Patent No.: US 6,713,379 B1
(45) Date of Patent: Mar. 30, 2004

(54) METHOD FOR FORMING A DAMASCENE STRUCTURE

(75) Inventors: Tzu-Kun Ku, Taipei (TW); Chia-Yang Wu, Tainan (TW)

(73) Assignee: Silicon Integrated Systems, Corp. (TW)

( * ) Notice: Subject to any disclaimer, the term of this patent is extended or adjusted under 35 U.S.C. 154(b) by 0 days.

(21) Appl. No.: 10/359,629

(22) Filed: Feb. 7, 2003

(51) Int. Cl.⁷ ............................................. H01L 21/44
(52) U.S. Cl. ...................................................... 438/618
(58) Field of Search ................. 438/618, 624, 438/625, 626

(56) References Cited

U.S. PATENT DOCUMENTS 6,534,813 B1 * 3/2003 Park et al. .................. 257/300
6,583,043 B2 * 6/2003 Shroff et al. ................ 438/618

* cited by examiner

Primary Examiner—David Nelms
Assistant Examiner—Quoc Hoang
(74) Attorney, Agent, or Firm—Birch, Stewart, Kolasch & Birch, LLP

(57) ABSTRACT

A method for forming a damascene structure. An insulating layer is deposited on a substrate. A capping layer and a hard mask layer are successively formed on the insulating layer. Subsequently, the hard mask layer is etched to form at least one opening using the capping layer as an etching stop layer. A conformable metal layer is formed over the hard mask layer and the surface of the opening, and the metal layer is then anisotropically etched to form a metal spacer over the sidewall of the opening. Next, the capping layer and the underlying insulating layer under the opening are etched to form a trench therein. Next, the hard mask layer and the metal spacer are removed. Finally, the trench is filled with the conductive layer to complete the damascene structure after the substrate is cleaned.

19 Claims, 5 Drawing Sheets

METHOD FOR FORMING A DAMASCENE STRUCTURE

BACKGROUND OF THE INVENTION

1. Field of the Invention

The invention relates to the fabrication of structures in integrated circuit devices, and more particularly to a method of forming interconnects using a damascene process.

2. Description of the Related Art

Fabrication of integrated circuits (ICs) utilizes multilevel wiring structures to interconnect regions within devices and one or more devices within the ICs. Currently, damascene technology is a useful method for forming such structures and is widely applied in semiconductor industry.

Damascene is an interconnection fabrication process in which trenches are formed in an insulating layer and filled with metal to form the wiring layers. FIGS. 1a to 1d are cross-sections of the conventional method for forming a damascene structure. In FIG. 1a, a substrate 100, such as a silicon wafer, having metal wiring layers 102 therein, is provided. Next, a sealing layer 104, such as silicon nitride, is deposited on the substrate 100 to cover the wiring layers 102. Thereafter, an intermetal dielectric (IMD) layer 106 and a capping layer 108 are successively deposited over the sealing layer 104. The IMD layer 106 can be low k dielectric material, such as spin on glass (SOG), fluorinated $SiO_2$ (FSG), hydrogen silsesquioxane (HSQ), FLARE, or SiLK. Moreover, the capping layer 108 is used for protect the IMD layer 106 and can be silicon oxide. Next, a hard mask layer 110, such as silicon nitride, coated with a photoresist layer 112 having trench patterns, is formed on the capping layer 108. The hard mask is anisotropically etched using the photoresist layer 112 as a mask to form openings 114 therein.

Next, in FIG. 1b, after the photoresist layer 112 is removed, the exposed portions of the capping layer 108 under the openings 114 are etched by conventional reactive ion etching (RIE) to expose the insulating layer 106.

Unfortunately, the etching selectivity between hard mask layer 110 and capping layer 108 and the IMD layer 106 is poor, resulting in a tapered hard mask layer 110, as shown in FIG. 1b. When the insulating layer 106 is etched using the tapered hard mask layer 110 as an etch mask, trenches 116, having sloped profile, are formed therein. That is, undesired critical dimension of the trenches 116 causes the electrical properties of devices to change. The regions surrounded by dotted lines indicate the desired profile of hard mask layer 110.

In FIG. 1c, after-the tapered hard mask layer 110 is removed, the capping layer 108 is lost, especially in the region 117 between dense trenches 116.

Finally, In FIG. 1d, standard pre-cleaning is performed by inductively coupled plasma (ICP) process (in-situ argon ion sputter etching) to remove native oxide or polymer residue (not shown). Next, a conductive layer (not shown), such as copper, is formed on the capping layer 108 and fills the trenches 116. Commonly, a conformable barrier layer (not shown) is formed over the capping layer 108 and the surfaces of the trenches 116. Thereafter, the excess conductive and barrier layers are removed by chemical mechanical polishing (CMP) using the capping layer 108 as an etching stop to form damascene structures 118.

However, the loss of capping layer 108 between dense trenches 116 induces dishing and results in metal bridging 120 after CMP, degrading the reliability of devices.

In order to solve the problems, it has been suggested to use metal hard mask, such as titanium nitride or tantalum nitride, thereby increasing the etching selectivity between the hard mask and capping layer and IMD layer. The trenches having vertical profile can be achieved by metal hard mask. Unfortunately, titanium or tantalum atoms of the hard mask are sputtered out by argon ions during pre-cleaning and deposited on the inner wall of the ICP chamber, causing the ICP etch chamber to fail.

SUMMARY OF THE INVENTION

Accordingly, an object of the invention is to provide a method for forming a damascene structure to protect the low k dielectric layer from unintended etching or removal, thereby preventing critical dimension (CD) variation and metal bridging.

Another object of the invention is to provide a method for forming a damascene structure to avoid ICP etch chamber failure after pre-cleaning.

To achieve the and other advantages, the invention provides a novel method for forming a damascene structure. First, an insulating layer is deposited on a substrate. A capping layer and a hard mask layer are successively formed on the insulating layer. Subsequently, the hard mask layer is etched to form at least one opening using the capping layer as an etching stop layer. A conformable metal layer is formed over the hard mask layer and the surface of the opening, and the metal layer is then anisotropically etched to form a metal spacer over the sidewall of the opening. Next, the capping layer and the underlying insulating layer under the opening are etched to form a trench therein. Next, the hard mask layer and the metal spacer are removed. Finally, the trench is filled with the conductive layer to complete the damascene structure after cleaning the substrate by argon ion sputter etching in an inductively coupled plasma (ICP) chamber.

The insulating layer contains a low k dielectric layer. The capping layer can be undoped silicon glass (USG) and the hard mask layer can be silicon nitride or silicon carbide. Moreover, the metal spacer has a thickness about 100~500 Å and can be aluminum or a barrier material of titanium nitride (TiN) or tantalum nitride (TaN).

DESCRIPTION OF THE DRAWINGS

For a better understanding of the present invention, reference is made to a detailed description to be read in conjunction with the accompanying drawings, in which.

DETAILED DESCRIPTION OF THE INVENTION

Figure 1A:
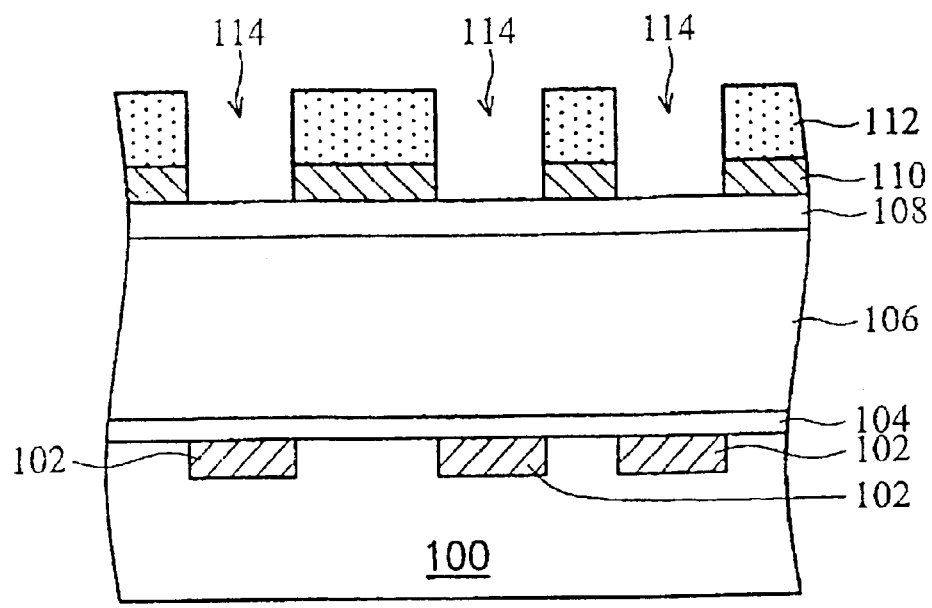
FIGS. 1a to 1d are cross-sections of the conventional method for forming a damascene structure.
Figure 1B:
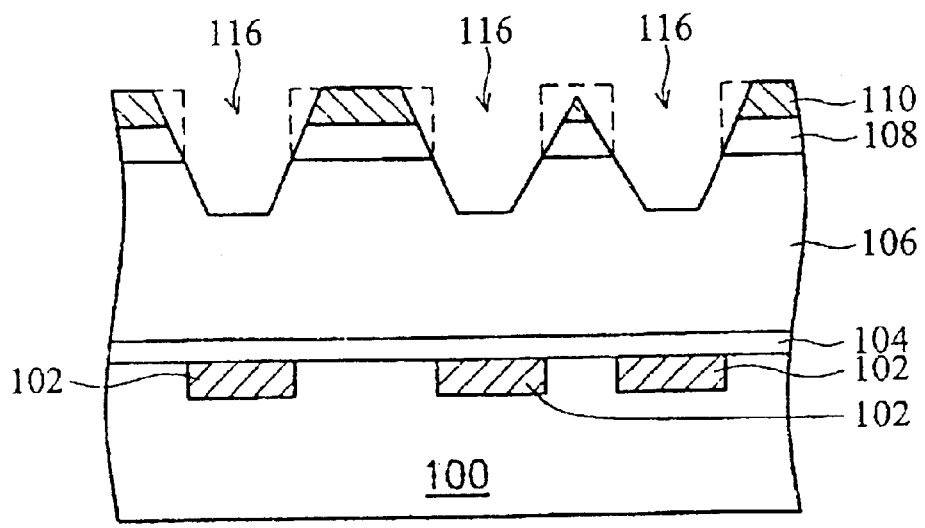
Figure 1C:
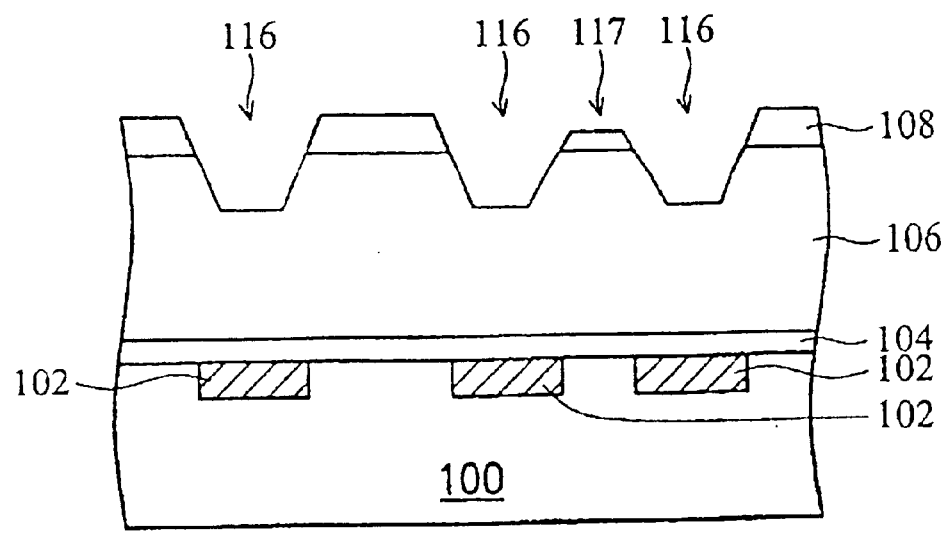
Figure 1D:
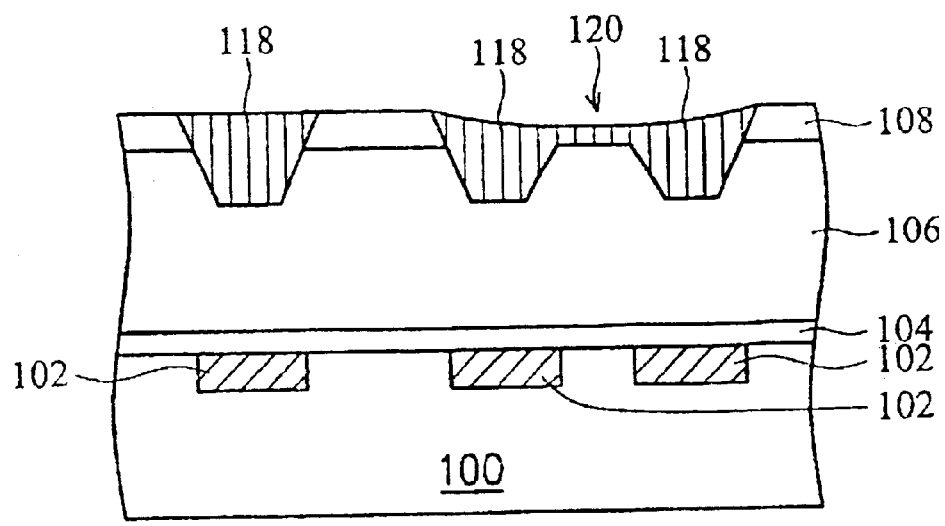

A preferred embodiment of the present invention is now described with reference to FIGS. 2a through 2e. First, in FIG. 2a, a substrate 200, such as a silicon wafer, having metal layers 202 therein, is provided. The metal layers 202 serve as lower wiring layers and can be copper or aluminum. Moreover, a sealing layer 204, such as silicon nitride, is deposited on the substrate 200 to cover the metal layers 202.

Next, a dielectric layer 206 is formed by conventional deposition, such as chemical vapor deposition (CVD), on the sealing layer 204 overlying the substrate. 200. In this invention, the dielectric layer 206 is used as an IMD layer 206. The IMD layer 206 may commonly use low k dielectric materials in semiconductor processing. For example, the IMD layer 206 is spin on glass (SOG), HSQ, FSG, black diamond, FLARE, or SiLK. The IMD layer 206 is preferably deposited to a thickness range from 4,000~10,000 Å.

Next, a capping layer 208 and a hard mask layer 210 are successively formed on the dielectric layer 206 by conventional deposition, such as CVD. In this invention, the capping layer 208 can be silicon oxide, such as USG, which protects the IMD layer 206 and is used as a stop layer for subsequent CMP. The capping layer 208 has a thickness of about 1,000~1,500 Å. Moreover, the hard mask layer 210 can be silicon nitride or silicon carbide with a thickness of about 1,000~1,500 Å.

Subsequently, a photoresist layer 214 having trench patterns is coated on the hard mask layer 210. In addition, an anti-refection coating (ARC) layer 212, such as silicon oxynitride, can be optionally formed between the photoresist layer 214 and the hard mask layer 210 to reduce standing wave effect and optical proximity effect. Next, the ARC layer 212 and the underlying hard mask layer 210 are anisotropically etched by RIE using the capping layer 208 as an etching stop layer to form openings 216 therein.

Figure 2A:
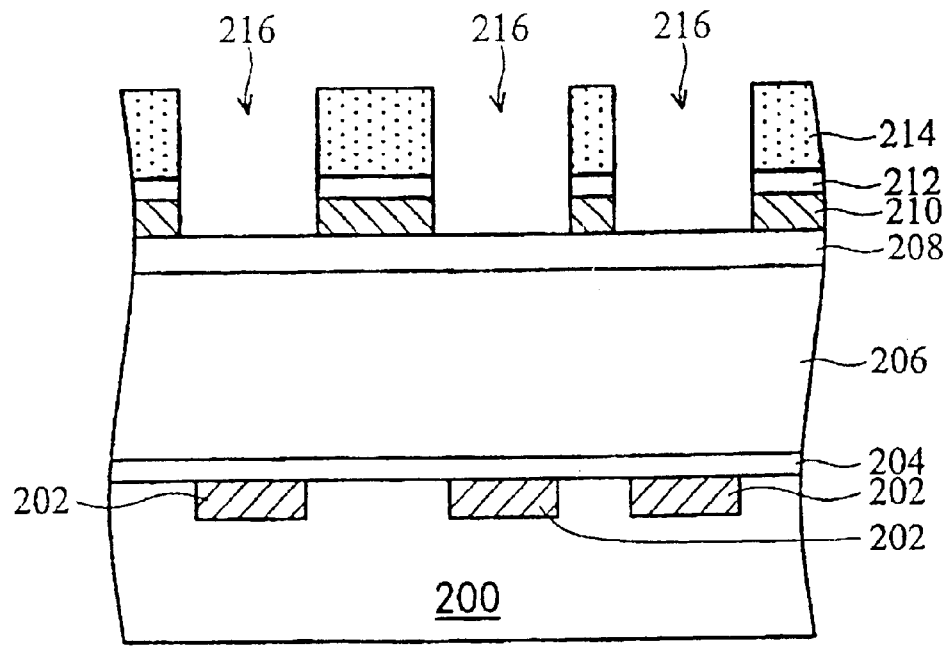
FIGS. 2a to 2e are cross-sections showing a method of forming a damascene structure according to the present invention.
Figure 2B:
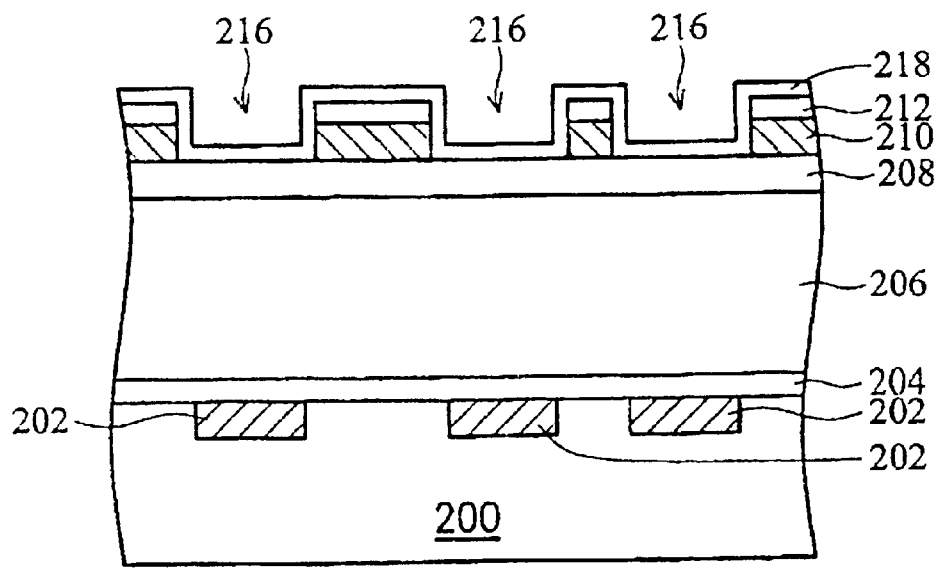
Figure 2C:
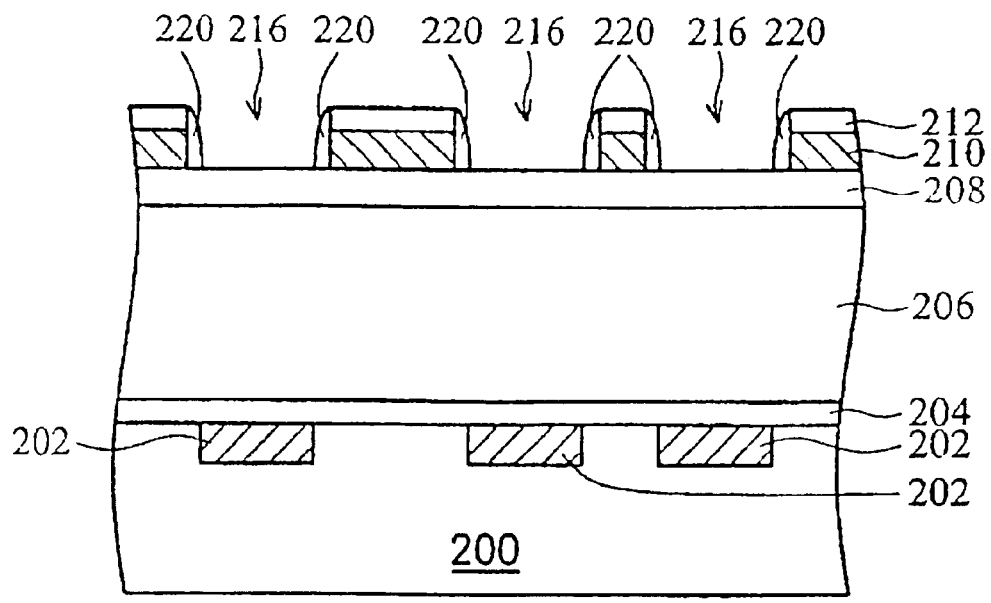
Figure 2D:
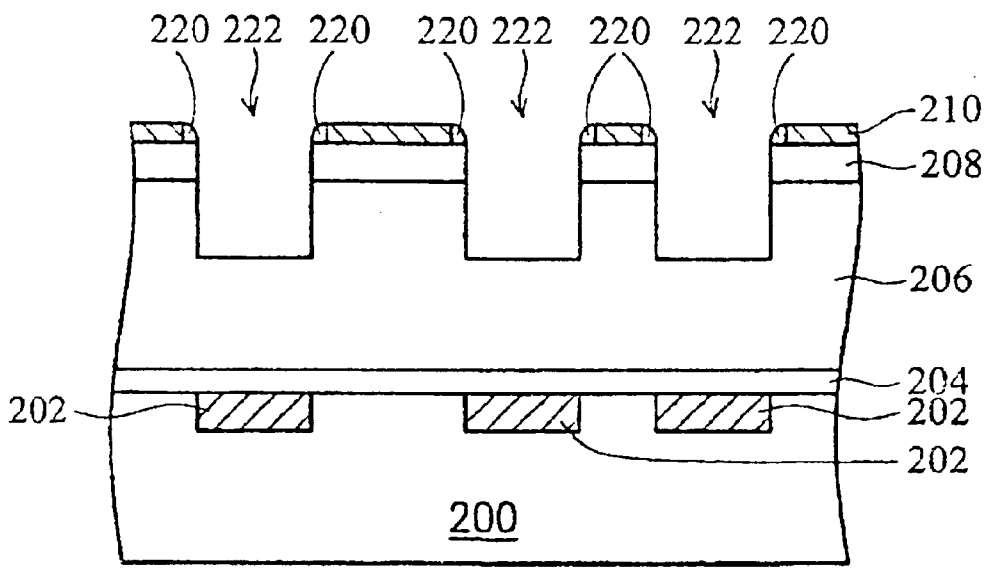

Next, FIGS. 2b to 2d show the critical steps of the invention. In FIG. 2b, the photoresist layer 214 is removed by oxygen plasma or suitable solvent without damaging the dielectric layer 208 due to the protection of the capping layer 208. Next, a conformable metal layer 218 is formed over the ARC layer 212 and the surface of the openings 216. In this invention, the metal layer 218 has a thickness of about 100~500 Å, and may consist of aluminum or commonly used barrier material, such as titanium nitride or tantalum nitride. Moreover, the metal layer 218 can be formed by conventional physical vapor deposition (PVD) or chemical vapor deposition (CVD), preferably, ionized PVD (I-PVD).

Subsequently, in FIG. 2c, the metal layer 218 is anisotropically etched by RIE to form a metal spacer 220 over the sidewall of each opening 216. In addition, if the metal layer 218 is formed by I-PVD, the subsequent anisotropic etching for forming metal spacer 220 can use in-situ argon ion sputter etching. Accordingly, the process steps can be simplified, thereby increasing the throughput.

Next, in FIG. 2d, the capping layer 208 and the underlying dielectric layer 206 under the opening 216 are etched to form trenches 222 in the dielectric layer 206. After etching, the ARC layer 212 is completely removed and the hard mask layer 210 and metal spacer 220 are partially consumed.

Compared with the prior art, since the metal spacers 220 protect the sidewalls of the hard mask layer 210 from etching, the trenches 222 having a vertical profile can be achieved, thereby preventing CD variation. Moreover, the capping layer 208 also be protected by hard mask layer 210 and metal spacers 220, it is useful for subsequent CMP.

Figure 2E:
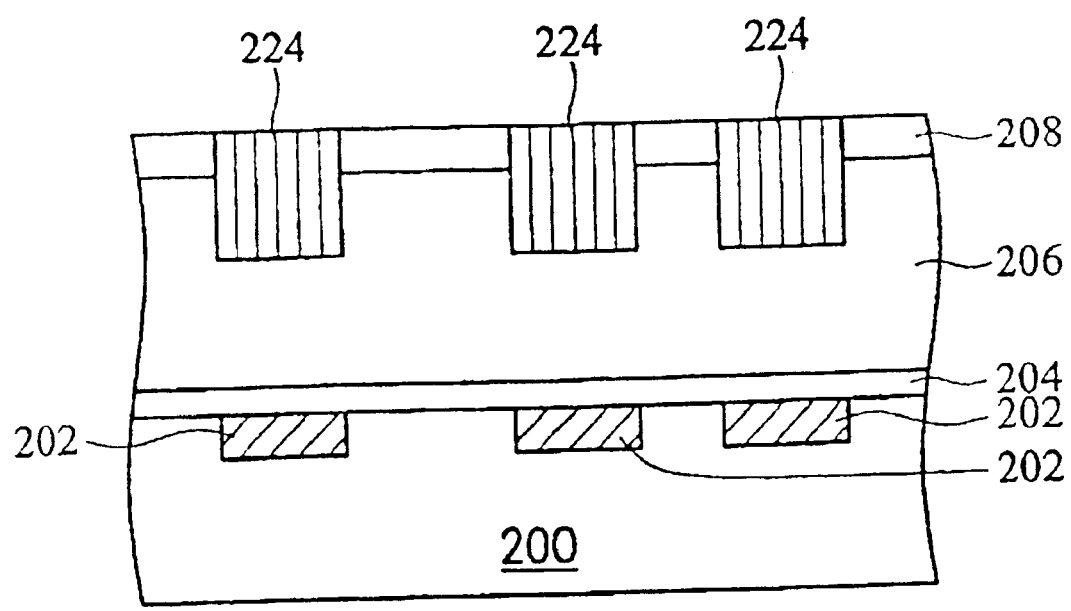

Finally, in FIG. 2e, the hard mask layer 210 is removed to simultaneously lift off the remaining metal spacers 220. Thereafter, also, standard pre-cleaning is performed by ICP (argon ion sputter etching) to remove native oxide or polymer residue (not shown). Next, a conductive layer (not shown), such as copper, is formed on the capping layer 208 and fills in the trenches 222. Commonly, a conformable barrier layer (not shown) is formed over the capping layer 208 and the surfaces of the trenches 222 before filling the conductive layer. Thereafter, excess conductive layer and barrier layer are removed by conventional polishing, such as chemical mechanical polishing (CMP), using the capping layer 208 as a stop layer to complete damascene structures 224.

According to the invention, the metal spacers 220 composed by barrier material or aluminum are removed with the hard mask layer 210 before pre-cleaning. The ICP etch chamber does not fail, since no contaminant is deposited therein. Moreover, the capping layer 208 between dense trenches 220 is not consumed before CMP, and metal bridging can be effectively prevented, thereby increasing the reliability of devices.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a damascene structure, comprising the steps of:
   depositing an insulating layer on a substrate;
   forming a capping layer and a hard mask layer successively on the insulating layer;
   etching the hard mask layer to form at least one opening using the capping layer as an etching stop layer;
   forming a metal spacer over the sidewall of the opening;
   etching the capping layer and the underlying insulating layer under the opening to form a trench therein;
   removing the hard mask layer and the metal spacer; and
   filling the trench with a conductive layer to complete the damascene structure.

2. The method as claimed in claim 1, further comprising cleaning the substrate before filling the trench with the conductive layer.

3. The method as claimed in claim 2, wherein the cleaning is argon ion sputter etching in an inductively coupled plasma (ICP) chamber.

4. The method as claimed in claim 1, wherein the insulating layer contains a low k dielectric layer.

5. The method as claimed in claim 1, wherein the capping layer is undoped silicon glass (USG).

6. The method as claimed in claim 5, wherein the capping layer has a thickness of about 1,000–1,500 Å.

7. The method as claimed in claim 1, wherein the hard mask layer is silicon nitride or silicon carbide.

8. The method as claimed in claim 7, wherein the hard mask layer has a thickness of about 1,000–1,500 Å.

9. The method as claimed in claim 1, further comprising forming an anti-reflection coating layer on the hard mask layer before etching the hard mask layer.

10. The method as claimed in claim 9, wherein the anti-reflection coating layer is silicon oxynitride.

11. The method as claimed in claim 1, wherein the step of forming the metal spacer comprises:
    forming a conformable metal layer over the hard mask layer and the surface of the opening; and
    anisotropically etching the metal layer to form the metal spacer over the sidewall of the opening.

12. The method as claimed in claim 11, wherein the metal layer has a thickness of about 100–500 Å.

13. The method as claimed in claim 11, wherein the metal layer is a barrier material of titanium nitride or tantalum nitride.

14. The method as claimed in claim 11, wherein the metal layer is formed by physical vapor deposition or chemical vapor deposition.

15. The method as claimed in claim 11, wherein the anisotropic etching is reactive ion etching (RIE).

16. The method as claimed in claim 11, wherein the metal layer is formed by ionized physical vapor deposition.

17. The method as claimed in claim 16, wherein the anisotropic etching is in-situ argon ion sputter etching.

18. The method as claimed in claim 1, wherein the metal spacer is aluminum with a thickness of about 100–500 Å.

19. The method as claimed in claim 1, wherein the conductive layer is copper.

* * * * *